(12) United States Patent
Takahashi et al.

(10) Patent No.: US 12,432,851 B2
(45) Date of Patent: Sep. 30, 2025

(54) PRINTED WIRING BOARD

(71) Applicant: SUMITOMO ELECTRIC INDUSTRIES, LTD., Osaka (JP)

(72) Inventors: Kenji Takahashi, Osaka (JP); Shoichiro Sakai, Osaka (JP); Kou Noguchi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 3 days.

(21) Appl. No.: 18/038,008

(22) PCT Filed: Jun. 22, 2022

(86) PCT No.: PCT/JP2022/024889
§ 371 (c)(1),
(2) Date: May 20, 2023

(87) PCT Pub. No.: WO2023/276817
PCT Pub. Date: Jan. 5, 2023

(65) Prior Publication Data
US 2023/0422396 A1    Dec. 28, 2023

(30) Foreign Application Priority Data
Jun. 28, 2021 (JP) ................... 2021-106970

(51) Int. Cl.
*H05K 1/02* (2006.01)
*H05K 1/16* (2006.01)

(52) U.S. Cl.
CPC .......... *H05K 1/0296* (2013.01); *H05K 1/165* (2013.01)

(58) Field of Classification Search
CPC ............ H05K 1/02; H05K 1/16; H05K 1/165; H05K 1/0296
USPC ....................................... 174/260
See application file for complete search history.

(56) References Cited

U.S. PATENT DOCUMENTS
2020/0022262 A1    1/2020   Okamoto et al.

FOREIGN PATENT DOCUMENTS

| JP | 2005-051050 A | 2/2005 |
|---|---|---|
| JP | 2016-9854 A | 1/2016 |
| JP | 2018-98415 A | 6/2018 |
| JP | 2021-57391 A | 4/2021 |
| WO | 2017/199747 A1 | 11/2017 |
| WO | 2018/211733 A1 | 11/2018 |

*Primary Examiner* — Tremesha W Burns
(74) *Attorney, Agent, or Firm* — Renner, Otto, Boisselle & Sklar, LLP (57) ABSTRACT

A printed wiring board includes: a base film having a main surface; a wiring disposed on the main surface; and at least one plating lead disposed on the main surface and connected to the wiring.

7 Claims, 13 Drawing Sheets

PRINTED WIRING BOARD

TECHNICAL FIELD

The present disclosure relates to a printed wiring board. The present application claims priority based on Japanese Patent Application No. 2021-106970 filed on Jun. 28, 2021, the entire contents of which are incorporated herein by reference.

BACKGROUND ART

For example, Japanese Patent Laying-Open No. 2016-9854 (PTL 1) describes a printed wiring board. The printed wiring board described in PTL 1 has a base film and a wiring disposed on a main surface of the base film. The wiring has a seed layer disposed on the main surface of the base film, a core disposed on the seed layer, and a shrink layer covering the core.

CITATION LIST

Patent Literature

PTL 1: Japanese Patent Laying-Open No. 2016-9854

SUMMARY OF INVENTION

A printed wiring board of the present disclosure includes: a base film having a main surface; a wiring disposed on the main surface; and at least one plating lead disposed on the main surface and connected to the wiring.

DETAILED DESCRIPTION

Problem to be Solved by the Present Disclosure

In the formation of the wiring of the printed wiring board described in PTL 1, first, the seed layer is formed on the main surface of the base film. Second, a resist provided with an opening is formed on the seed layer. Third, electroplating (first electroplating) is performed onto the seed layer exposed from the opening of the resist by feeding current to the seed layer. In this way, the core is formed. Third, the seed layer existing between the resist and the core is removed and current is fed to the core, thereby performing electroplating (second electroplating) to cover the core. In this way, the shrink layer is formed.

However, in PTL 1, it is unknown how current is fed to the core during the second electroplating.

The present disclosure provides a printed wiring board to feed current in an excellent manner when forming a wiring on a main surface of a base film.

Advantageous Effect of the Present Disclosure

According to the printed wiring board of the present disclosure, current can be fed in an excellent manner when forming a wiring on a main surface of a base film.

DESCRIPTION OF EMBODIMENTS

First, embodiments of the present disclosure will be listed and described.

(1) A printed wiring board according to an embodiment includes: a base film having a main surface; a wiring disposed on the main surface; and at least one plating lead disposed on the main surface and connected to the wiring.

According to the printed wiring board of (1), current can be fed in an excellent manner when forming the wiring on the main surface of the base film.

(2) In the printed wiring board of (1), the at least one plating lead may include a first plating lead connected to the wiring at a first position, and a second plating lead connected to the wiring at a second position. An electric resistance value of the wiring between the first position and the second position may be 2Ω or less.

According to the printed wiring board of (2), current can be fed in a more excellent manner when forming the wiring on the main surface of the base film.

(3) In the printed wiring board of (2), the main surface may be a first main surface and a second main surface opposite to the first main surface. The wiring may have a first wiring and a second wiring each disposed on the first main surface, and may have a third wiring disposed on the second main surface. The at least one plating lead may further include a third plating lead connected to the wiring at a third position. The first wiring may include a first end and a second end opposite to the first end. The second wiring may include a third end and a fourth end opposite to the third end. The third wiring may include a fifth end and a sixth end opposite to the fifth end. The first end and the third end may be the first position and the third position respectively. The second position may be a portion of the third wiring between the fifth end and the sixth end. The second end may be electrically connected to the fifth end. The fourth end may be electrically connected to the sixth end. An electric resistance value of the wiring between the second position and the third position may be 2Ω or less.

According to the printed wiring board of (3), current can be fed in a more excellent manner when forming the wiring on the main surface of the base film.

(4) In the printed wiring board of (3), the first wiring may include a first coil formed by winding the first wiring in a form of a spiral. The second wiring may include a second coil formed by winding the second wiring in a form of a spiral. The third wiring may include a third coil and a fourth coil each formed by winding the third wiring in a form of a spiral. The first coil and the second coil may respectively overlap with the third coil and the fourth coil in a thickness direction of the base film. The second position may be located between the third coil and the fourth coil.

(5) The printed wiring board of (1) may further include a bypass lead. The bypass lead may have a first portion electrically connected to one end of the wiring, and a second portion electrically connected to the other end of the wiring. The first portion and the second portion may be separated from each other.

According to the printed wiring board of (5), the plurality of portions included in the wiring on the main surface of the base film are connected in parallel by the bypass lead to decrease the electric resistance value of the wiring, with the result that current can be fed in a more excellent manner when forming the wiring.

(6) In the printed wiring board of (5), the main surface may be a first main surface and a second main surface opposite to the first main surface. The wiring may have a first wiring and a second wiring each disposed on the first main surface, and may have a third wiring disposed on the second main surface. The first wiring may include a first end and a second end opposite to the first end. The second wiring may include a third end and a fourth end opposite to the third end. The third wiring may include a fifth end and a sixth end opposite to the fifth end. The first end may be electrically connected to the fifth end. The second end may be electrically connected to the first portion. The third end may be electrically connected to the sixth end. The fourth end may be electrically connected to the second portion.

(7) In the printed wiring board of (6), the first wiring may include a first coil formed by winding the first wiring in a form of a spiral. The third wiring may include a second coil formed by winding the third wiring in a form of a spiral. The first coil may overlap with the second coil in a thickness direction of the base film. The second end, the third end, and the fourth end may be located inside the first coil when viewed in a plan view. The sixth end may be located inside the second coil when viewed in a plan view.

(8) In the printed wiring board according to any one of (1) to (7), each of the wiring and the at least one plating lead may have a seed layer disposed on the main surface, a first electroplating layer disposed on the seed layer, and a second electroplating layer covering the seed layer and the first electroplating layer.

Details of Embodiments of the Present Disclosure

Next, details of the embodiments of the present disclosure will be described with reference to figures. In the figures described below, the same or corresponding portions are denoted by the same reference characters, and the same explanation will not be described repeatedly.

First Embodiment

A printed wiring board (hereinafter referred to as "printed wiring board 100") according to the first embodiment will be described.
<Configuration of Printed Wiring Board 100>
The following describes a configuration of printed wiring board 100.

Figure 1:
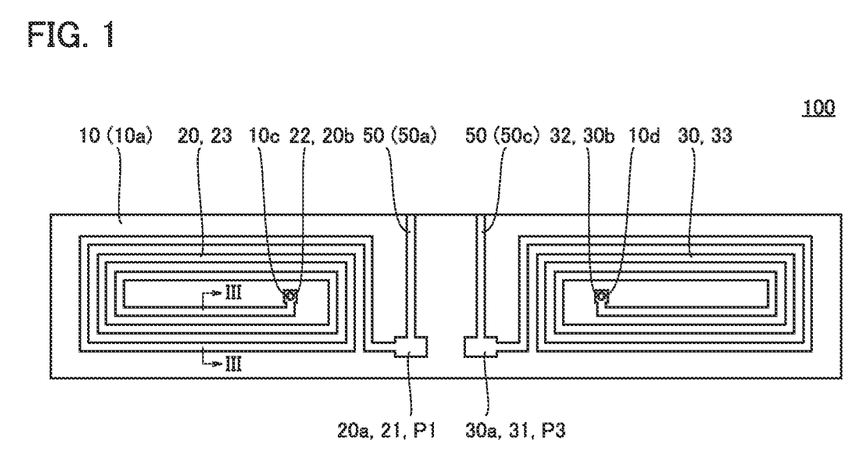
FIG. 1 is a plan view of a printed wiring board 100.
Figure 2:
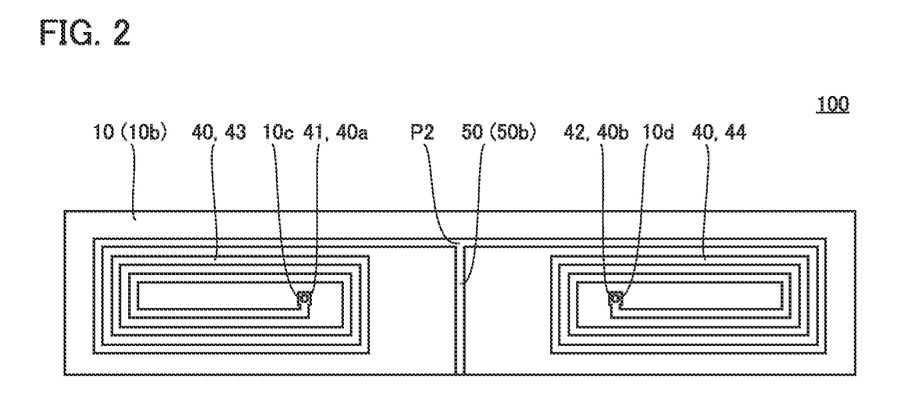
FIG. 2 is a bottom view of printed wiring board 100.
Figure 3:
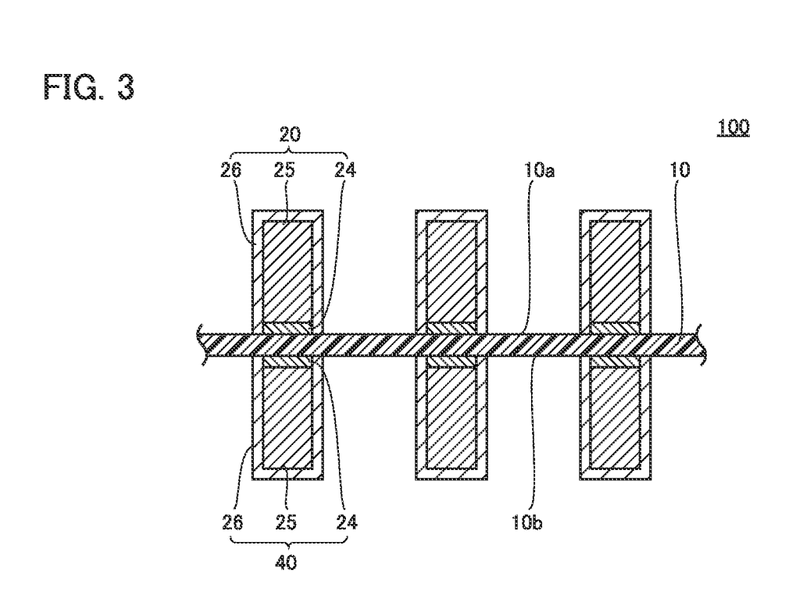
FIG. 3 is a cross sectional view at III-III in FIG. 1.

FIG. 1 is a plan view of printed wiring board 100. FIG. 2 is a bottom view of printed wiring board 100. FIG. 3 is a cross sectional view at III-III in FIG. 1. As shown in FIGS. 1, 2, and 3, printed wiring board 100 has a base film 10, a first wiring 20, a second wiring 30, a third wiring 40, and at least one plating lead 50.

Base film 10 is composed of an insulative material having flexibility. That is, printed wiring board 100 is a flexible printed wiring board. Specific examples of the material of base film 10 include polyimide, polyethylene terephthalate, and a fluororesin.

Main surfaces of base film 10 are a first main surface 10a and a second main surface 10b. Second main surface 10b is opposite to first main surface 10a. A direction from first main surface 10a toward second main surface 10b may be referred to as a thickness direction of base film 10.

First wiring 20, second wiring 30, and third wiring 40 are disposed on the main surfaces of base film 10. More specifically, first wiring 20 and second wiring 30 are disposed on first main surface 10a. Third wiring 40 is disposed on second main surface 10b.

First wiring 20 has a first end 20a and a second end 20b. Second end 20b is opposite to first end 20a. First wiring 20 has a terminal 21 and a land 22. Terminal 21 is located at first end 20a. Land 22 is located at second end 20b. First wiring 20 has a first coil 23. First coil 23 is formed by winding first wiring 20 in the form of a spiral on first main surface 10a. Second end 20b is located inside first coil 23 when viewed in a plan view (when viewed in a direction orthogonal to first main surface 10a).

Second wiring 30 has a third end 30a and a fourth end 30b. Fourth end 30b is opposite to third end 30a. Second wiring 30 has a terminal 31 and a land 32. Terminal 31 is located at third end 30a. Land 32 is located at fourth end 30b. Second wiring 30 has a second coil 33. Second coil 33 is formed by winding second wiring 30 in the form of a spiral on first main surface 10a. Fourth end 30b is located inside second coil 33 when viewed in a plan view (when viewed in the direction orthogonal to first main surface 10a).

Third wiring 40 has a fifth end 40a and a sixth end 40b. Sixth end 40b is opposite to fifth end 40a. Third wiring 40 has a land 41 and a land 42. Land 41 is located at fifth end 40a. Land 42 is located at sixth end 40b.

A through hole 10c and a through hole 10d are formed in base film 10. Each of through hole 10c and through hole 10d extends through base film 10 along the thickness direction. Through hole 10c is located at a position to overlap with land 22 and land 41. Through hole 10d is located at a position to overlap with land 32 and land 42.

Land 22 and land 41 are electrically connected together by a conductor (not shown) formed on an inner wall surface of through hole 10c. Land 32 and land 42 are electrically connected together by a conductor (not shown) formed on an inner wall surface of through hole 10d. Thus, first wiring 20, second wiring 30, and third wiring 40 are integrated as a wiring disposed on the main surfaces of base film 10.

Third wiring 40 has a third coil 43 and a fourth coil 44. Third coil 43 is formed by winding third wiring 40 in the form of a spiral on second main surface 10b. Fourth coil 44 is formed by winding third wiring 40 in the form of a spiral on second main surface 10b. Third coil 43 and fourth coil 44 respectively overlap with first coil 23 and second coil 33 in the thickness direction of base film 10.

Plating leads 50 are connected to the wirings disposed on the main surfaces of base film 10. In printed wiring board 100, the number of plating leads 50 is three. These three plating leads 50 are defined as a first plating lead 50a, a second plating lead 50b, and a third plating lead 50c.

First plating lead 50a is connected to the wiring disposed on the main surface of base film 10 at a first position P1. More specifically, first plating lead 50a is connected to first end 20a (terminal 21). That is, first position P1 is first end 20a.

Second plating lead 50*b* is connected to the wiring disposed on the main surface of base film 10 at a second position P2. More specifically, second plating lead 50*b* is connected to a portion of third wiring 40 between fifth end 40*a* and sixth end 40*b*. That is, second position P2 is a portion of third wiring 40 between fifth end 40*a* and sixth end 40*b*.

Third plating lead 50*c* is connected to the wiring disposed on the main surface of base film 10 at a third position P3. More specifically, third plating lead 50*c* is connected to third end 30*a* (terminal 31). That is, third position P3 is third end 30*a*.

It should be noted that each of first plating lead 50*a*, second plating lead 50*b*, and third plating lead 50*c* extends to reach an end of base film 10.

First position P1 and second position P2 are determined such that an electric resistance value of the wirings (first wiring 20 and third wiring 40) between first position P1 and second position P2 is 2Ω or less. Second position P2 and third position P3 are determined such that an electric resistance value of the wiring (second wiring 30 and third wiring 40) between second position P2 and third position P3 is 2Ω or less. It should be noted that the electric resistance value of the wiring between first end 20*a* and third end 30*a* is, for example, 2Ω or more. It should be noted that the electric resistance value of the wiring is measured by bringing a probe of a tester into contact with a target portion for the measurement.

First wiring 20 has a seed layer 24, a first electroplating layer 25, and a second electroplating layer 26.

Seed layer 24 is disposed on the main surface (first main surface 10*a*) of base film 10. Seed layer 24 has, for example, a first layer and a second layer. The first layer of seed layer 24 is disposed on the main surface (first main surface 10*a*) of base film 10. The second layer of seed layer 24 is disposed on the first layer of seed layer 24. The first layer of seed layer 24 is, for example, a sputtering layer (layer formed by sputtering) of a nickel-chromium alloy. The second layer of seed layer 24 is an electroless plating layer (layer formed by electroless plating) of copper.

First electroplating layer 25 is formed by electroplating. First electroplating layer 25 is composed of copper. First electroplating layer 25 is disposed on seed layer 24. Second electroplating layer 26 is formed by electroplating. Second electroplating layer 26 is composed of copper. Second electroplating layer 26 covers seed layer 24 and first electroplating layer 25. More specifically, second electroplating layer 26 is disposed on the side surfaces of seed layer 24 and first electroplating layer 25 and the upper surface of first electroplating layer 25.

Third wiring 40 has the same structure as that of first wiring 20 (seed layer 24, first electroplating layer 25 and second electroplating layer 26). Although not shown, each of second wiring 30 and plating lead 50 also has the same structure as that of first wiring 20.

<Method of Manufacturing Printed Wiring Board 100>

The following describes a method of manufacturing printed wiring board 100.

Figure 4:
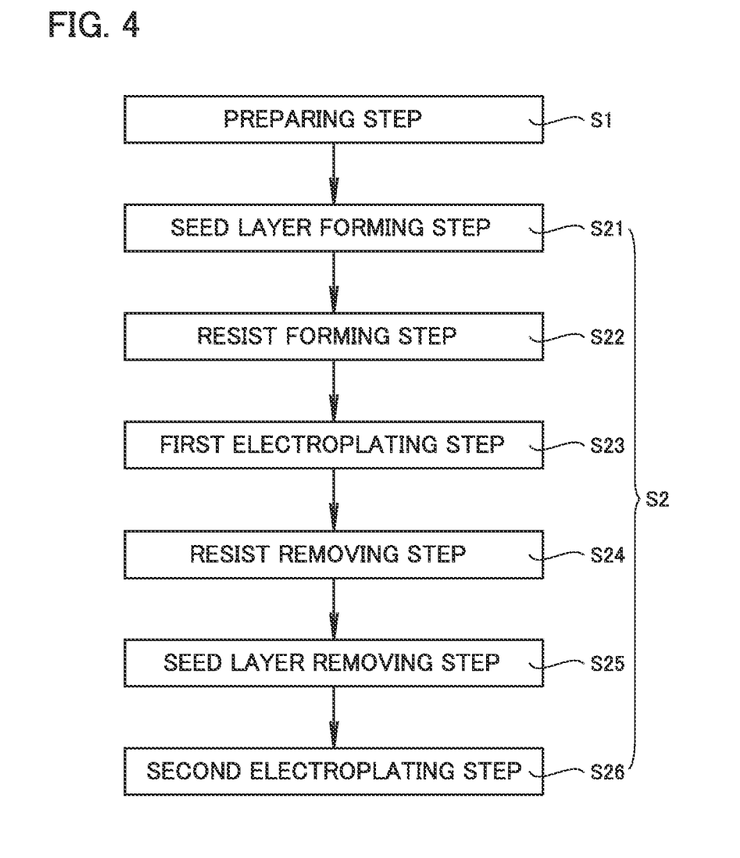
FIG. 4 is a flowchart showing a method of manufacturing printed wiring board 100.

FIG. 4 is a flowchart showing the method of manufacturing printed wiring board 100. As shown in FIG. 4, the method of manufacturing printed wiring board 100 has a preparing step S1 and a wiring forming step S2. Wiring forming step S2 is performed after preparing step S1.

In preparing step S1, base film 10 is prepared. The wirings (first wiring 20, second wiring 30, and third wiring 40) and plating leads 50 are not formed on the main surfaces of base film 10 prepared in preparing step S1.

In wiring forming step S2, first wiring 20, second wiring 30, third wiring 40, and plating leads 50 are formed. Wiring forming step S2 is performed using a semi-additive method.

More specifically, wiring forming step S2 has a seed layer forming step S21, a resist forming step S22, a first electroplating step S23, a resist removing step S24, a seed layer removing step S25, and a second electroplating step S26.

Resist forming step S22 is performed after seed layer forming step S21, and first electroplating step S23 is performed after resist forming step S22. Resist removing step S24 is performed after first electroplating step S23, and seed layer removing step S25 is performed after resist removing step S24. Second electroplating step S26 is performed after seed layer removing step S25.

Figure 5:
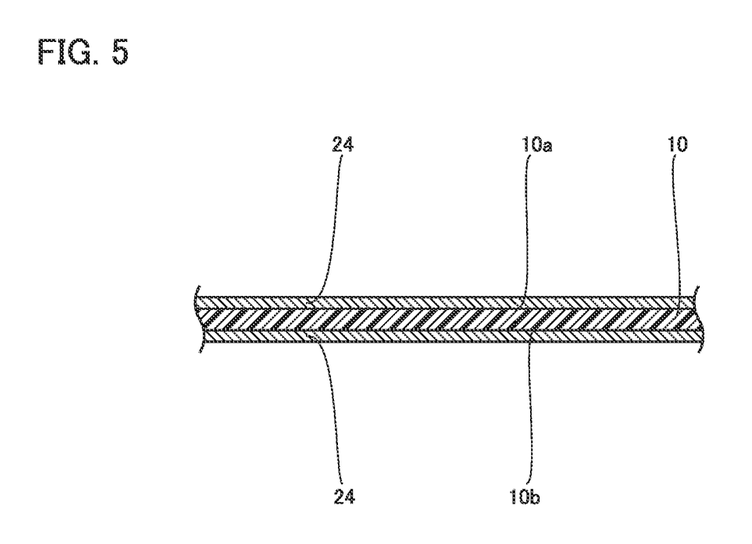
FIG. 5 is a cross sectional view of a base film 10 after a seed layer forming step S21.

FIG. 5 is a cross sectional view of base film 10 after seed layer forming step S21. As shown in FIG. 5, in seed layer forming step S21, seed layer 24 is formed on each of the main surfaces (first main surface 10*a* and second main surface 10*b*) of base film 10. Seed layer 24 is formed by sputtering and electroless plating.

Figure 6:
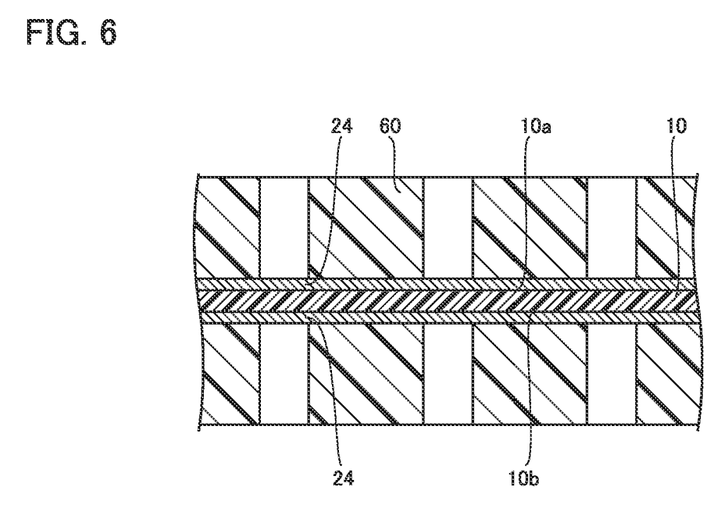
FIG. 6 is a cross sectional view of base film 10 after a resist forming step S22.

FIG. 6 is a cross sectional view of base film 10 after resist forming step S22. As shown in FIG. 6, in resist forming step S22, a resist 60 is formed on seed layer 24. Resist 60 is formed by applying a photosensitive organic material on seed layer 24, exposing the applied photosensitive organic material to light, developing it, and performing patterning. Resist 60 is provided with an opening.

Figure 7:
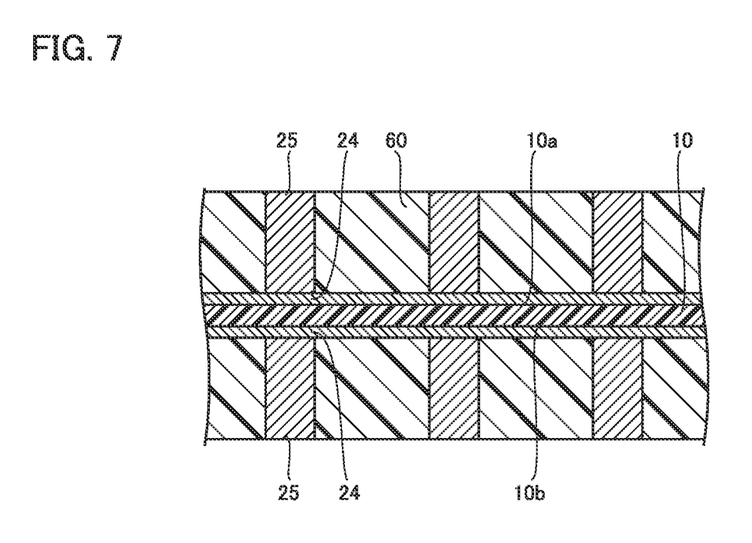
FIG. 7 is a cross sectional view of base film 10 after a first electroplating step S23.

FIG. 7 is a cross sectional view of base film 10 after first electroplating step S23. As shown in FIG. 7, in first electroplating step S23, first electroplating layer 25 is formed on seed layer 24 exposed from the opening of resist 60. First electroplating layer 25 is formed by performing electroplating onto seed layer 24 exposed from the opening of resist 60 by feeding current to seed layer 24.

Figure 8:
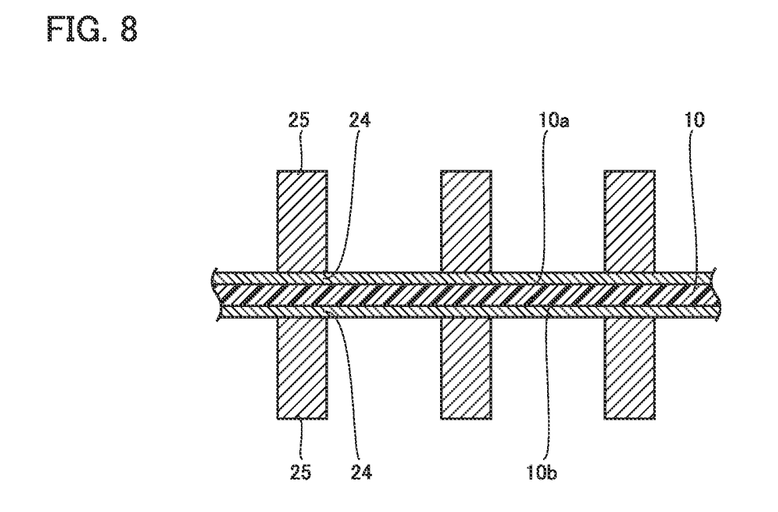
FIG. 8 is a cross sectional view of base film 10 after a resist removing step S24.
Figure 9:
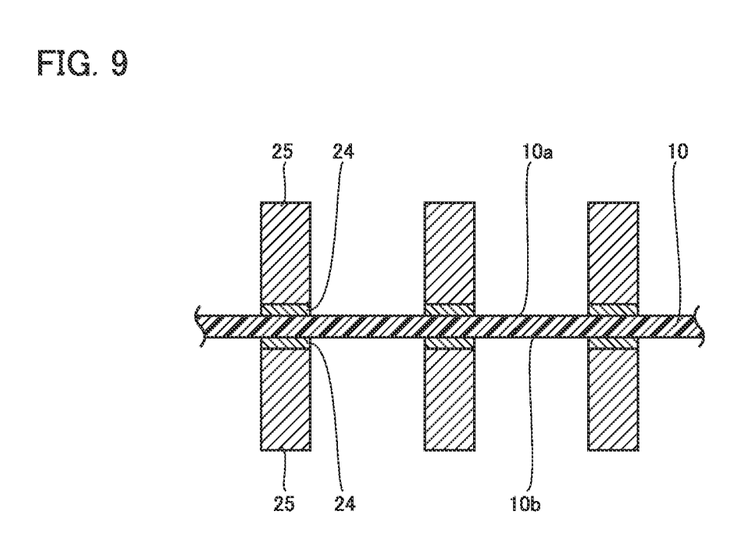
FIG. 9 is a cross sectional view of base film 10 after a seed layer removing step S25.

FIG. 8 is a cross sectional view of base film 10 after resist removing step S24. As shown in FIG. 8, in resist removing step S24, resist 60 is removed by detaching resist 60 from seed layer 24. FIG. 9 is a cross sectional view of base film 10 after seed layer removing step S25. As shown in FIG. 9, seed layer 24 exposed from first electroplating layer 25 is removed by etching. The etching is wet etching, for example.

In second electroplating step S26, second electroplating layer 26 is formed. Second electroplating layer 26 is formed by feeding current to seed layer 24 and first electroplating layer 25 so as to perform electroplating. The current is fed through seed layer 24 and first electroplating layer 25 of plating lead 50 (first plating lead 50*a*, second plating lead 50*b*, and third plating lead 50*c*).

Seed layer 24 and first electroplating layer 25 of plating lead 50 extend to a feeding terminal located at an end portion of base film 10 before being cut into individual pieces. After second electroplating step S26 is performed, base film 10 is cut into individual pieces. Therefore, plating lead 50 extend so as to reach an end of base film 10 after being cut into individual pieces.

<Effects of Printed Wiring Board 100>

Effects of printed wiring board 100 will be described below.

A voltage applied to seed layer 24 and first electroplating layer 25 in the second electroplating step S26 is decreased in a direction away from the feeding terminal. Therefore, second electroplating layer 26 is less likely to be formed at a position away from the feeding terminal. That is, at a position away from the feeding terminal, cross sectional areas of the wirings (first wiring 20, second wiring 30, and third wiring 40) disposed on the main surfaces of base film 10 may be small, thus resulting in an increased electric resistance value.

However, in printed wiring board 100, current is fed to seed layers 24 and first electroplating layers 25 of the wirings (first wiring 20, second wiring 30, and third wiring 40) disposed on the main surfaces of base film 10 through seed layers 24 and first electroplating layers 25 of plating leads 50 (first plating lead 50*a*, second plating lead 50*b*, and third plating lead 50*c*).

Therefore, even at a position away from the current feeding position, sufficient voltage can be supplied to seed layer 24 and first electroplating layer 25. As a result, according to printed wiring board 100, the thickness of second electroplating layer 26 (cross sectional area of the wiring) can be secured, with the result that the electric resistance value of the wiring disposed on each of the main surfaces of base film 10 can be suppressed from being increased.

It has been illustratively described that the wirings are disposed on both first main surface 10*a* and second main surface 10*b*; however, the same effect can be exhibited also when a wiring is disposed on only one of first main surface 10*a* and second main surface 10*b*.

Second Embodiment

Hereinafter, a printed wiring board (hereinafter referred to as "printed wiring board 200") according to the second embodiment will be described. Here, differences from printed wiring board 100 will be mainly described, and the same explanation will not be described repeatedly.

<Configuration of Printed Wiring Board 200>

The following describes a configuration of printed wiring board 200.

Figure 10:
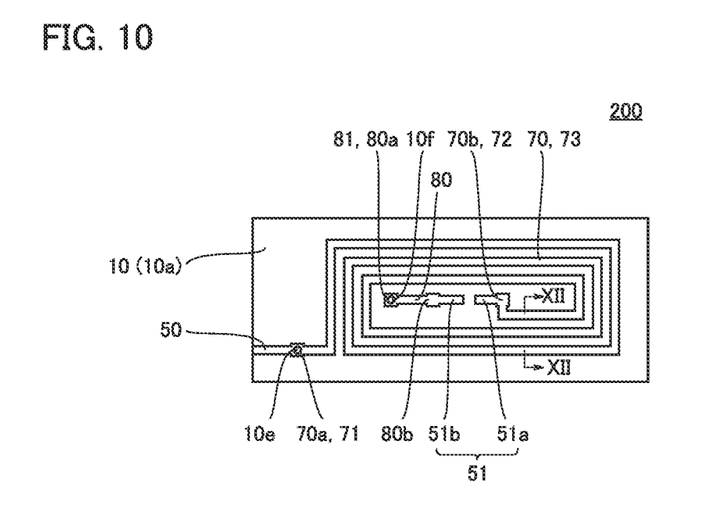
FIG. 10 is a plan view of a printed wiring board 200.
Figure 11:
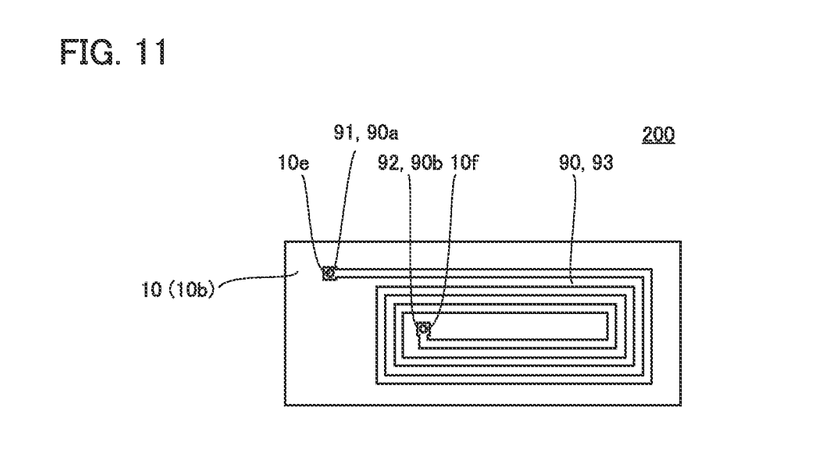
FIG. 11 is a bottom view of printed wiring board 200.
Figure 12:
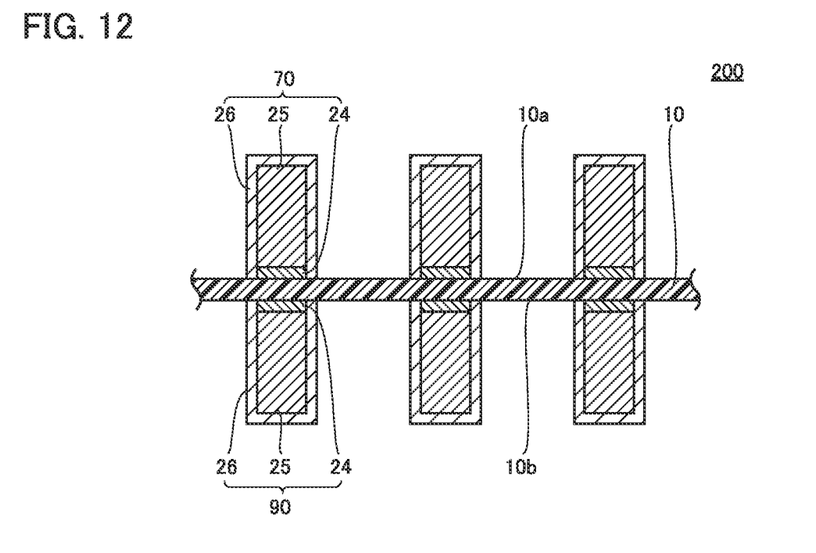
FIG. 12 is a cross sectional view at XII-XII in FIG. 10.

FIG. 10 is a plan view of printed wiring board 200. FIG. 11 is a bottom view of printed wiring board 200. FIG. 12 is a cross sectional view at XII-XII in FIG. 10. As shown in FIGS. 10, 11, and 12, printed wiring board 200 has a base film 10 and a plating lead 50.

Printed wiring board 200 has a first wiring 70, a second wiring 80, and a third wiring 90 instead of first wiring 20, second wiring 30, and third wiring 40 as the wirings disposed on the main surfaces of base film 10. Printed wiring board 200 further has a bypass lead 51. Each of first wiring 70, second wiring 80, third wiring 90, and bypass lead 51 has a seed layer 24, a first electroplating layer 25, and a second electroplating layer 26.

First wiring 70 is disposed on a first main surface 10*a*. First wiring 70 has a first end 70*a* and a second end 70*b*. Second end 70*b* is opposite to first end 70*a*. First wiring 70 has a land 71. Land 71 is located at first end 70*a*. First wiring 70 has a first coil 72. First coil 72 is formed by winding first wiring 70 in the form of a spiral on first main surface 10*a*. Second end 70*b* is located inside first coil 72 when viewed in a plan view.

Second wiring 80 is disposed on first main surface 10*a*. Second wiring 80 has a third end 80*a* and a fourth end 80*b*. Fourth end 80*b* is opposite to third end 80*a*. Second wiring 80 has a land 81. Land 81 is located at third end 80*a*. Second wiring 80 (third end 80*a* and fourth end 80*b*) is located inside first coil 72 when viewed in a plan view.

Third wiring 90 is disposed on second main surface 10*b*. Third wiring 90 has a fifth end 90*a* and a sixth end 90*b*. Sixth end 90*b* is opposite to fifth end 90*a*. Third wiring 90 has a land 91 and a land 92. Land 91 is located at fifth end 90*a*. Land 92 is located at sixth end 90*b*. Third wiring 90 has a second coil 93. Second coil 93 is formed by winding third wiring 90 in the form of a spiral on second main surface 10*b*. Second coil 93 overlaps with first coil 72 in the thickness direction of base film 10. Sixth end 90*b* is located inside second coil 93 when viewed in a plan view.

A through hole 10*e* and a through hole 10*f* are formed in base film 10. Each of through hole 10*e* and through hole 10*f* extends through base film 10 along the thickness direction. Through hole 10*e* is located at a position to overlap with land 71 and land 91 when viewed in a plan view. Through hole 10*f* is located at a position to overlap with land 81 and land 92 when viewed in a plan view.

Land 71 and land 91 are electrically connected together by a conductor (not shown) formed on an inner wall surface of through hole 10*e*. Land 81 and land 92 are electrically connected together by a conductor (not shown) formed on an inner wall surface of through hole 10*f*. Thus, first wiring 70, second wiring 80, and third wiring 90 are integrated as a wiring disposed on the main surfaces of base film 10.

Plating lead 50 is connected to first wiring 70. More specifically, plating lead 50 is connected to, for example, first end 70*a*.

Bypass lead 51 is disposed on first main surface 10*a*. Bypass lead 51 has a first portion 51*a* and a second portion 51*b*. First portion 51*a* is electrically connected to second end 70*b*, and second portion 51*b* is electrically connected to fourth end 80*b*. First portion 51*a* and second portion 51*b* are separated from each other. That is, the second end 70*b* side of first wiring 70 and the fourth end 80*b* side of second wiring 80 are not electrically connected together.

Although not shown, each of second end 70*b* and fourth end 80*b* is electrically connected to a terminal disposed on a main surface of a printed wiring board different from printed wiring board 200.

<Method of Manufacturing Printed Wiring Board 200>

The following describes a method of manufacturing printed wiring board 200.

The method of manufacturing printed wiring board 200 has a preparing step S1 and a wiring forming step S2. In wiring forming step S2 of the method of manufacturing printed wiring board 200, first wiring 70, second wiring 80, third wiring 90, plating lead 50, and bypass lead 51 are formed.

Figure 13:
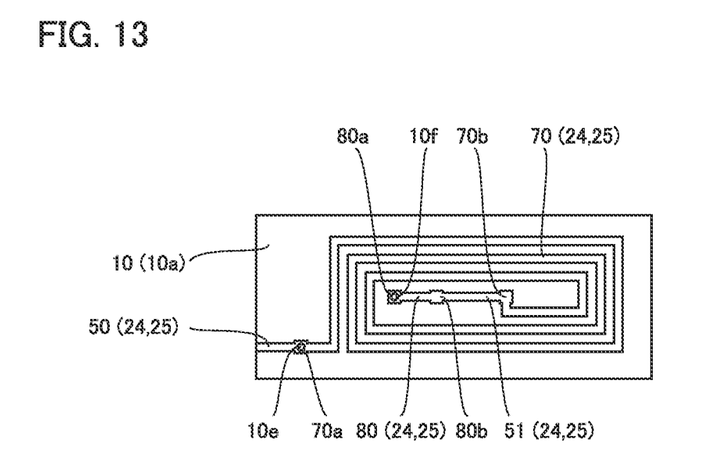
FIG. 13 is a plan view of a base film 10 after a seed layer removing step S25 in a method of manufacturing printed wiring board 200.

FIG. 13 is a plan view of base film 10 after seed layer removing step S25 in the method of manufacturing printed wiring board 200. As shown in FIG. 13, in the method of manufacturing printed wiring board 200, seed layer 24 and first electroplating layer 25 of bypass lead 51 are not separated after seed layer removing step S25. Therefore, in the method of manufacturing printed wiring board 200, bypass lead 51 not separated into first portion 51*a* and second portion 51*b* is formed by performing second electroplating step S26. Bypass lead 51 formed not to be separated is separated into first portion 51*a* and second portion 51*b* after second electroplating step S26 is performed.

<Effects of Printed Wiring Board 200>

Effects of printed wiring board 200 will be described below.

As described above, in the method of manufacturing printed wiring board 200, bypass lead 51 is not separated after seed layer removing step S25. Therefore, in the method of manufacturing printed wiring board 200, first wiring 70 and each of second wiring 80 and third wiring 90 are connected in parallel after seed layer removing step S25. This results in a reduced electric resistance value between first end 70a and second end 70b when performing the second electroplating forming step.

Thus, according to printed wiring board 200, since sufficient voltage can be supplied to each of seed layer 24 and first electroplating layer 25 even at a position away from the current feeding position, the thickness of second electroplating layer 26 (cross sectional areas of the wirings) can be secured, with the result that the electric resistance value of the wiring disposed on each of the main surfaces of base film 10 can be suppressed from being increased.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

10: base film; 10a: first main surface; 10b: second main surface; 10c, 10d, 10e, 10f: through hole; 20: first wiring; 20a: first end; 20b: second end; 21: terminal; 22: land; 23: first coil; 24: seed layer; 25: first electroplating layer; 26: second electroplating layer; 30: second wiring; 30a: third end; 30b: fourth end; 31: terminal; 32: land; 33: second coil; 40: third wiring; 40a: fifth end; 40b: sixth end; 41: land; 42: land; 43: third coil; 44: fourth coil; 50: plating lead; 50a: first plating lead; 50b: second plating lead; 50c: third plating lead; 51: bypass lead; 51a: first portion; 51b: second portion; 60: resist; 70: first wiring; 70a: first end; 70b: second end; 71: land; 72: second coil; 80: second wiring; 80a: third end; 80b: fourth end; 81: land; 90: third wiring; 90a: fifth end; 90b: sixth end; 91, 92: land; 93: second coil; 100, 200: printed wiring board; P1: first position; P2: second position; P3: third position; S1: preparing step; S2: wiring forming step; S21: seed layer forming step; S22: resist forming step; S23: first electroplating step; S24: resist removing step; S25: seed layer removing step; S26: second electroplating step.

The invention claimed is:

1. A printed wiring board comprising:
a base film having a main surface;
a wiring disposed on the main surface; and
at least one plating lead disposed on the main surface and connected to the wiring,
wherein
the at least one plating lead includes a first plating lead connected to the wiring at a first position, and a second plating lead connected to the wiring at a second position, and
an electric resistance value of the wiring between the first position and the second position is 20 or less,
wherein
the main surface is a first main surface and a second main surface opposite to the first main surface,
the wiring has a first wiring and a second wiring each disposed on the first main surface, and has a third wiring disposed on the second main surface,
the at least one plating lead further includes a third plating lead connected to the wiring at a third position, and
an electric resistance value of the wiring between the second position and the third position is 20 or less.

2. The printed wiring board according to claim 1, wherein
the first wiring includes a first end and a second end opposite to the first end,
the second wiring includes a third end and a fourth end opposite to the third end,
the third wiring includes a fifth end and a sixth end opposite to the fifth end,
the first end and the third end are the first position and the third position respectively,
the second position is a portion of the third wiring between the fifth end and the sixth end,
the second end is electrically connected to the fifth end, and
the fourth end is electrically connected to the sixth end.

3. The printed wiring board according to claim 2, wherein
the first wiring includes a first coil formed by winding the first wiring in a form of a spiral,
the second wiring includes a second coil formed by winding the second wiring in a form of a spiral,
the third wiring includes a third coil and a fourth coil each formed by winding the third wiring in a form of a spiral,
the first coil and the second coil respectively overlap with the third coil and the fourth coil in a thickness direction of the base film, and
the second position is located between the third coil and the fourth coil.

4. The printed wiring board according to claim 1, further comprising a bypass lead, wherein
the bypass lead has a first portion electrically connected to one end of the wiring, and a second portion electrically connected to the other end of the wiring, and
the first portion and the second portion are separated from each other.

5. The printed wiring board according to claim 4, wherein
the first wiring includes a first end and a second end opposite to the first end,
the second wiring includes a third end and a fourth end opposite to the third end,
the third wiring includes a fifth end and a sixth end opposite to the fifth end,
the first end is electrically connected to the fifth end,
the second end is electrically connected to the first portion,
the third end is electrically connected to the sixth end, and
the fourth end is electrically connected to the second portion.

6. The printed wiring board according to claim 5, wherein
the first wiring includes a first coil formed by winding the first wiring in a form of a spiral,
the third wiring includes a second coil formed by winding the third wiring in a form of a spiral,
the first coil overlaps with the second coil in a thickness direction of the base film,
the second end, the third end, and the fourth end are located inside the first coil when viewed in a plan view, and
the sixth end is located inside the second coil when viewed in a plan view.

7. The printed wiring board according to claim 1, wherein each of the wiring and the at least one plating lead has a seed layer disposed on the main surface, a first electroplating layer disposed on the seed layer, and a second electroplating layer covering the seed layer and the first electroplating layer.

* * * * *